United States Patent
Lee et al.

(10) Patent No.: US 7,157,977 B2
(45) Date of Patent: Jan. 2, 2007

(54) AUTOMATIC GAIN CONTROL FEEDBACK AMPLIFIER

(75) Inventors: Sang Heung Lee, Daejeon (KR); Hyeon Cheol Ki, Seoul (KR); Jin Yeong Kang, Daejeon (KR); Kyu Hwan Shim, Daejeon (KR); Kyong Ik Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 51 days.

(21) Appl. No.: 10/995,033

(22) Filed: Nov. 23, 2004

(65) Prior Publication Data

US 2006/0028279 A1    Feb. 9, 2006

(30) Foreign Application Priority Data

Nov. 24, 2003   (KR)   ..................... 10-2003-0083618

(51) Int. Cl.
    *H03F 3/08*   (2006.01)
(52) U.S. Cl. ............. 330/308; 250/214 A; 250/214 AG
(58) Field of Classification Search ........ 330/277–278, 330/282, 308, 110, 59; 250/214 A, 214 AG
    See application file for complete search history.

(56) References Cited

U.S. PATENT DOCUMENTS 5,532,471 A * 7/1996 Khorramabadi et al. 250/214 A
5,952,887 A * 9/1999 Katayanagi et al. ........ 330/308

FOREIGN PATENT DOCUMENTS

| JP | 57-194613 | 11/1982 |
|---|---|---|
| KR | 1998-071656 | 10/1998 |

* cited by examiner

*Primary Examiner*—Benny T. Lee
*Assistant Examiner*—Hieu Nguyen
(74) *Attorney, Agent, or Firm*—Mayer, Brown, Rowe & Maw LLP

(57) ABSTRACT

There is provided a feedback amplifier capable of easily controlling its dynamic range without a separate gain control signal generation circuit. The feedback amplifier includes an input terminal detecting an input voltage from input current, a feedback amplification unit amplifying the input voltage to generate an output signal, and an output terminal outputting a signal amplified by the feedback amplification unit. The feedback amplification unit includes a feedback circuit unit including a feedback resistor located between the input terminal and the output terminal, and a feedback transistor connected in parallel to the feedback resistor; and a bias circuit unit supplying a predetermined bias voltage to the feedback transistor of the feedback circuit unit and merged in the feedback amplification unit.

8 Claims, 2 Drawing Sheets

AUTOMATIC GAIN CONTROL FEEDBACK AMPLIFIER

BACKGROUND OF THE INVENTION

This application claims the priority of Korean Patent Application No. 10-2003-0083618, filed on Nov. 24, 2003, in the Korean Intellectual Property Office, the disclosure of which is incorporated herein in its entirety by reference.

1. Field of the Invention

The present invention relates to an optical communication system, and more particularly, to a feedback amplifier used as a preamplifier of an optical communication system.

2. Description of the Related Art

A general feedback amplifier includes an amplifier circuit for amplifying an input signal in order to provide an output voltage. In such a feedback amplifier, a feedback circuit for controlling levels of an output voltage signal is provided. The feedback circuit includes a feedback resistor connected between an input terminal and an output terminal and a transistor connected in parallel to the feedback resistor. The transistor receives a control signal through its base. Also, feedback current flowing through the feed circuit is controlled according to the control signal, thereby controlling an output voltage.

Such a feedback amplifier is disclosed in detail in Japanese Patent Publication No. 57-194613. The feedback amplifier will be schematically described below.

FIG. 1 is a circuit diagram of a general feedback amplifier 10 disclosed in the Japanese Patent Publication No. 57-194613. Referring to FIG. 1, the feedback amplifier 10 is connected between an input terminal IN and an output terminal OUT. The input terminal IN is connected to a photodiode PD connected with a power supply $V_{CC}$. Input current in corresponding to cathode current of the photodiode PD is applied to the input terminal IN.

The input terminal IN is connected to the base of a NPN transistor 11. The collector of the NPN transistor 11 is connected to the power supply $V_{CC}$ and the base of a NPN transistor 13 through a resistor 12. The collector of the NPN transistor 13 is connected to the power supply $V_{CC}$ and the emitter thereof is connected to the output terminal OUT and a ground through a resistor 14. Also, the emitter of the NPN transistor 11 is grounded.

The output terminal OUT is connected to the base of the transistor 11 through a resistor 15a located in a feedback circuit 15. The emitter of a transistor 15b located in the feedback circuit 15 is connected to the output terminal OUT and the collector of the transistor 15b is connected to the base of the transistor 11. A control signal V_AGC for controlling the feedback current is applied from an external circuit (not shown) to the base of the transistor 15b.

In such a feedback amplifier, if a control signal V_AGC of a low voltage is applied to the base of the transistor 15b, the transistor 15b is turned off so that trans-impedance between its collector and emitter sufficiently increases. Accordingly, the transistor 15b is open and the trans-impedance has the same resistance as a resistor 15a.

Thereafter, if the voltage of the control signal V_AGC increases, the transistor 15b is turned on and accordingly trans-impedance between its collector and emitter decreases. As a result, feedback resistance is reduced and trans-impedance is also reduced. As such, the gain of the feedback amplifier 10 is controlled according to the control signal V_AGC.

In other words, in the feedback amplifier 10, if a control signal V_AGC changes according to input current in, the control signal V_AGC should be set based on the input current until an output voltage S10 is saturated. Also, after a separate gain control signal generation circuit is formed in order to provide an appropriate signal value, the control signal V_AGC is applied to the feedback amplifier 10 through the gain control signal generation circuit.

However, due to such a separate gain control signal generation circuit required to obtain a wide dynamic range, an entire circuit configuration is complicated and controlling of the dynamic range is difficult.

SUMMARY OF THE INVENTION

The present invention provides a feedback amplifier capable of easily controlling its dynamic range without a separate gain control signal generation circuit.

According to an aspect of the present invention, there is provided a feedback amplifier comprising: an input terminal detected an input voltage by an input current; a feedback amplification unit amplifying the input voltage to generate an output signal; and an output terminal outputting the output signal amplified by the feedback amplification unit, wherein the feedback amplification unit comprises a feedback circuit unit including a feedback resistor located between the input terminal and the output terminal, and a feedback transistor connected in parallel to the feedback resistor; and a bias circuit unit supplying a predetermined bias voltage to the feedback transistor in the feedback circuit unit and merged in the feedback amplification unit.

Impedance of the feedback transistor changes according to the input current.

The input terminal comprises: a power supply; and a photodiode connected to the power supply, detecting an input optical signal.

The feedback amplification unit further comprises an amplification circuit unit and an output circuit unit, the amplification circuit unit comprises a first transistor whose base is connected to the input terminal and whose emitter is grounded, and a first resistor connected between a collector of the first transistor and a power supply, and the output circuit unit comprises a second transistor whose base is connected to the collector of the first transistor and whose collector is connected to the power supply, and a second resistor connected between an emitter of the second transistor and a ground.

The feedback amplifier further comprises a phase compensation circuit unit between the bias circuit unit and the amplification circuit unit. The phase compensation circuit unit further comprises a NPN transistor whose base is connected to the second bias resistor, whose collector is connected to the power supply, and whose emitter is connected to the collector of the first transistor of the amplification circuit unit.

The base of the feedback transistor of the feedback circuit unit is connected to the bias circuit unit so that a DC bias voltage is applied to the base of the feedback transistor, the collector of the feedback transistor is connected to the input terminal, and the emitter of the feedback transistor is connected to the output terminal.

According to another aspect of the present invention, there is provided a feedback amplifier comprising: an input terminal detected an input voltage by an input current; a feedback amplification unit amplifying the input voltage to generate an output signal; and an output terminal outputting the output signal amplified by the feedback amplification unit, wherein the feedback amplification unit comprises a feedback circuit unit including a feedback resistor and a feedback transistor connected in parallel to the feedback resistor, a DC bias voltage is applied to a base of the feedback transistor, and an emitter of the feedback transistor is connected to the output terminal.

The base of the feedback transistor is connected to a bias circuit unit for supplying a bias signal, the bias circuit unit includes a transistor whose collector and base are connected to each other and a bias resistor is connected to an emitter of the transistor, and the base and collector of the transistor are connected to the base of the feedback transistor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to the appended drawings. Like reference numbers refer to like components throughout the drawings.

Figure 1:
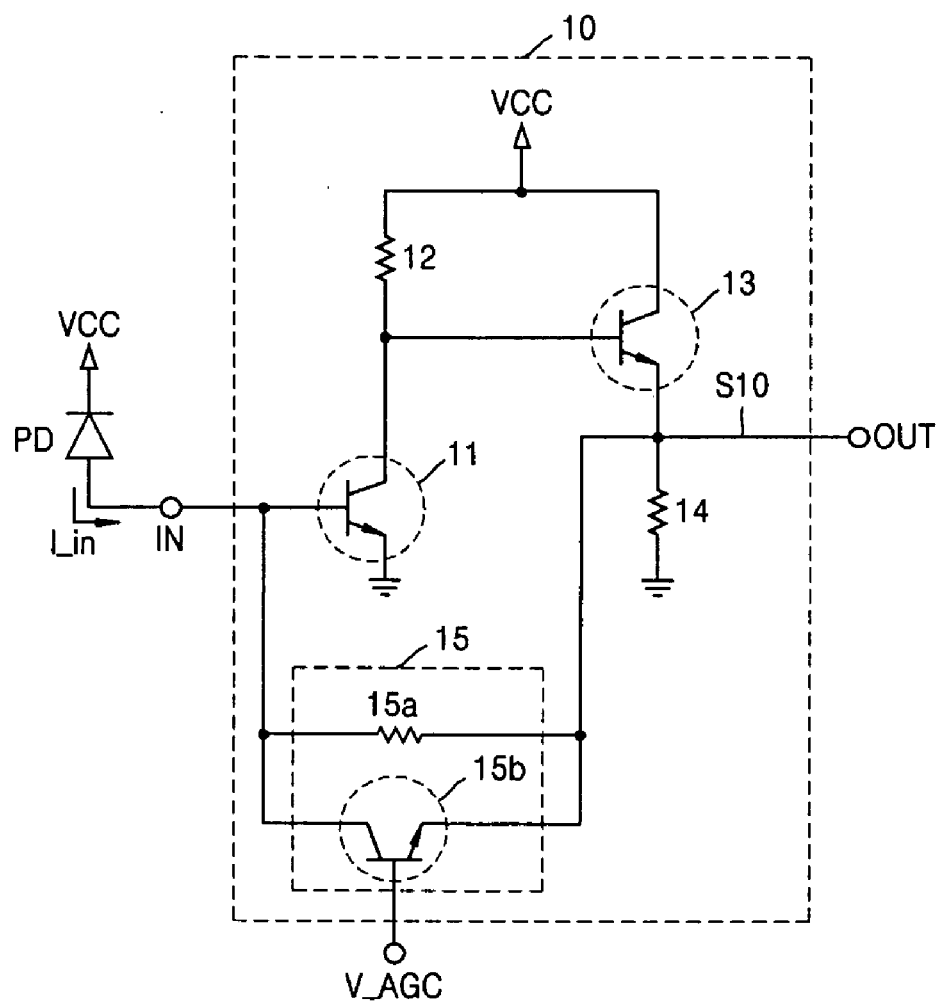
FIG. 1 is a circuit diagram of a conventional feedback amplifier.
Figure 2:
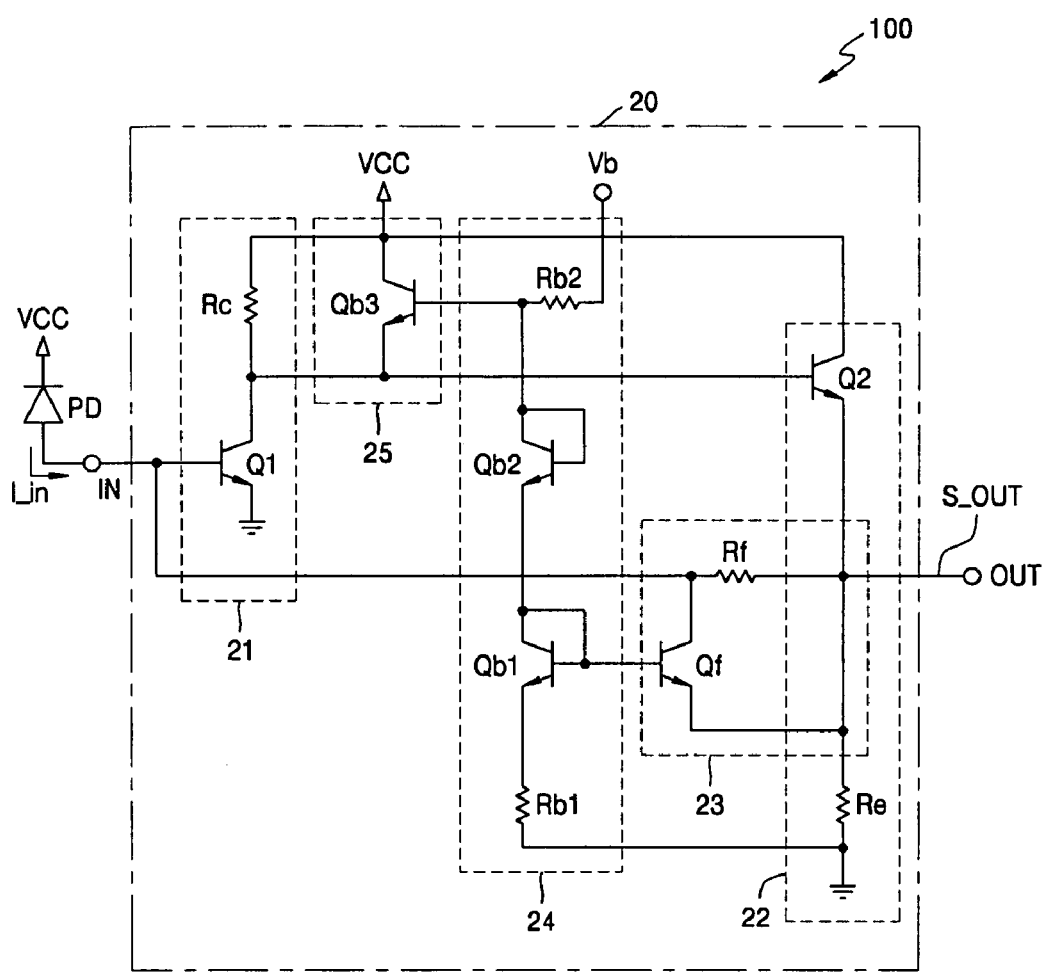
FIG. 2 is a circuit diagram of a feedback amplifier according to an embodiment of the present invention.

FIG. 2 is a circuit diagram of a feedback amplifier 100 according to an embodiment of the present invention.

Referring to FIG. 2, the feedback amplifier 100 includes an input terminal IN, an output terminal OUT, and a feedback amplification unit 20 connected between the input terminal IN and the output terminal OUT.

The input terminal IN is connected to a power supply $V_{CC}$ and a photodiode is connected between the input terminal IN and the power supply $V_{CC}$. Accordingly, an input voltage is detected by the photodiode. Also, cathode current of the photodiode PD, which is input current of the amplifier 100, is applied to the input terminal IN.

The feedback amplification unit 20 amplifies an input voltage and generate an output signal. The feedback amplification unit 20 includes an amplifier circuit 21, an output circuit 22, a feedback circuit 23, and a bias circuit 24, and can further include a phase compensation circuit 25.

Here, the amplifier circuit 21 includes a first NPN bipolar transistor Q1 (hereinafter, a NPN transistor is simply referred to as a transistor) and a first resistor Rc. The base of the first transistor Q1 is connected to the input terminal IN, the collector thereof is connected to the first resistor Rc, and the emitter thereof is grounded.

The output circuit 22 includes a second transistor Q2 and a second resistor Re. The base of the second transistor Q2 is connected to the collector of the first transistor Q1, the collector of the second transistor Q2 is connected to the collector of the first transistor 01, and the emitter of the second transistor Q2 is connected to the second resistor Re.

The feedback circuit 23 includes a feedback resistor Rf and a feedback transistor Qf connected in parallel to the feedback register Rf. The base of the feedback transistor Qf is connected to the bias circuit 24 and receives a DC bias voltage Vb from the bias circuit unit 24. The collector of the feedback transistor Qf is connected to the input terminal IN and the emitter thereof is connected to the output terminal OUT.

Also, the bias circuit 24 includes a first bias transistor Qb1, a second bias transistor Qb2, a first bias resistor Rb1, and a second bias resistor Rb2. The base and collector of the first bias transistor Qb1 are interconnected, and the interconnected base and collector are connected to the base of the feedback transistor Qf. Also, the emitter of the first bias transistor Qb1 is connected to the first bias resistor Rb1 grounded. Meanwhile, the base and collector of the second bias transistor Qb2 are interconnected, and the emitter thereof is connected to the collector of the first bias transistor Qb1. Also, the second bias resistor Rb2 is connected between the collector of the second bias transistor Qb2 and the DC bias voltage Vb.

The phase compensation circuit 25 is a NPN transistor Qb3, whose base is connected to the second bias resistor Rb2, whose collector is connected to the power supply $V_{CC}$, and whose emitter is connected to the collector of the first transistor Q1. The phase compensation circuit 25 prevents output waveforms from being distorted due to increase of feedback current.

Hereinafter, the operation of the feedback amplifier 100 according to the present invention is described.

Since the base of the feedback transistor Qf in the feed circuit 23 is connected to the base of the first bias transistor Qb1 in the bias circuit 24, as described above, the operation of the feedback transistor Qf is controlled by the bias voltage Vb applied to the bias circuit 24. Accordingly, impedance between the collector and emitter of the feedback transistor Qf is controlled by a voltage of the output terminal OUT.

Here, since a voltage of the output terminal OUT is nearly within an operation threshold voltage Q_point if input current I_in input to the feedback amplification unit 20 is sufficiently small, the feedback transistor Qf is turned off and the collector and the emitter of the feedback transistor Qf are disconnected. Accordingly, since the feedback circuit 23 of the feedback amplification unit 20 is composed of resistors with constant resistances, that is, a feedback resistor and a transistor resistor, the feedback amplification unit 20 provides no auto gain control (AGC) function. Therefore, the voltage of the output terminal OUT becomes nearly the same as a product of the feedback resistance Rf and the input current (I_in) value.

If the input current I_in sufficiently increases, the voltage of the output terminal OUT becomes lower than the operation threshold voltage Q_point and the feedback transistor Qf is turned on. Accordingly, current flows through the feedback transistor Qf, which reduces impedance between the collector and emitter of the feedback transistor Qf. As a result, the entire impedance of the feedback circuit 23 is reduced and the gain of the feedback amplification unit 20 is also reduced, thereby performing an auto gain control (AGC) operation.

At this time, since the magnitude of a minimal input current I_in required to start the AGC operation is decided by a bias voltage Vb applied to the base of the feedback transistor Qf, the magnitude of the minimal input current I_in can be freely controlled by adjusting the vias voltage Vb.

As a result, since a voltage of the base of the feedback transistor Qf is decided by a voltage supplied from the bias circuit 24 and impedance between the collector and emitter of the feedback transistor Qf is automatically controlled by a voltage of the output terminal OUT, no control signal generation circuit is required. Also, since the more the input current I_in is, the less the impedance of the feedback circuit 23 is, the gain of the feedback amplification unit 20 can be automatically controlled. Therefore, the feedback amplification unit 20 operates in a wide dynamic range.

As described above, according to the present invention, since a bias circuit for controlling the operation of a feedback transistor is installed in a feedback amplifier, it is possible to easily control a dynamic range of the feedback amplifier without installing a separate gain control signal generation circuit outside the feedback amplifier.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A feedback amplifier comprising:
   an input terminal detected an input voltage by an input current;
   a feedback amplification unit amplifying the input voltage to generate an output signal; and
   an output terminal outputting the output signal amplified by the feedback amplification unit,
   wherein the feedback amplification unit comprises a feedback circuit unit including a feedback resistor located between the input terminal and the output terminal, and a feedback transistor connected in parallel to the feedback resistor; and a bias circuit unit supplying a predetermined bias voltage to the feedback transistor in the feedback circuit unit and merged in the feedback amplification unit;
   wherein the bias circuit unit comprises a first bias transistor, a second bias transistor, a first bias resistor, and a second bias resistor,
   a base of the first bias transistor is connected to the base of the feedback transistor, a collector of the first bias transistor is connected to the base of the first bias transistor, and an emitter of the first bias transistor is connected to the first bias resistor, the first bias resistor grounded, and
   a base and a collector of the second bias transistor are connected to each other, an emitter of the second bias transistor is connected to the collector of the first bias transistor, and the collector of the second bias transistor is connected to the second bias resistor, the second bias resistor connected to the bias voltage.

2. The feedback amplifier of claim 1, wherein impedance of the feedback transistor changes according to the input current.

3. The feedback amplifier of claim 1, wherein the input terminal comprises:
   a power supply; and
   a photodiode connected to the power supply, detecting an input optical signal.

4. The feedback amplifier of claim 1, wherein the feedback amplification unit further comprises an amplification circuit unit and an output circuit unit,
   the amplification circuit unit comprises a first transistor whose base is connected to the input terminal and whose emitter is grounded, and a first resistor connected between a collector of the first transistor and a power supply, and
   the output circuit unit comprises a second transistor whose base is connected to the collector of the first transistor and whose collector is connected to the power supply, and a second resistor connected between an emitter of the second transistor and a ground.

5. The feedback amplifier of claim 1, further comprising a phase compensation circuit unit between the bias circuit unit and the amplification circuit unit.

6. The feedback amplifier of claim 5, wherein the phase compensation circuit unit further comprises a NPN transistor whose base is connected to the second bias resistor, whose collector is connected to the power supply, and whose emitter is connected to the collector of the first transistor of the amplification circuit unit.

7. The feedback amplifier of claim 1, wherein the base of the feedback transistor of the feedback circuit unit is connected to the bias circuit unit so that a DC bias voltage is applied to the base of the feedback transistor, the collector of the feedback transistor is connected to the input terminal, and the emitter of the feedback transistor is connected to the output terminal.

8. A feedback amplifier comprising:
   an input terminal detected an input voltage by an input current;
   a feedback amplification unit amplifying the input voltage to generate an output signal; and
   an output terminal outputting the output signal amplified by the feedback amplification unit,
   wherein the feedback amplification unit comprises a feedback circuit unit including a feedback resistor and a feedback transistor connected in parallel to the feedback resistor, a DC bias voltage is applied to a base of the feedback transistor, and an emitter of the feedback transistor is connected to the output terminal; and
   wherein the base of the feedback transistor is connected to a bias circuit unit for supplying a bias signal, the bias circuit unit includes a transistor whose collector and base are connected to each other and a bias resistor is connected to an emitter of the transistor, and the base and collector of the transistor are connected to the base of the feedback transistor.

* * * * *